(12) United States Patent
Root et al.

(10) Patent No.: US 7,954,911 B2
(45) Date of Patent: Jun. 7, 2011

(54) HOUSING HAVING A FRAME AROUND THE HOUSING OPENING AND ACCESSORIES WHICH CAN BE ATTACHED THERETO

(75) Inventors: Paul Root, Bad Endbach (DE); Markus Neuhof, Ehringshausen-Niederlemp (DE)

(73) Assignee: Rittal GmbH & Co. KG, Herborn (DE)

( * ) Notice: Subject to any disclaimer, the term of this patent is extended or adjusted under 35 U.S.C. 154(b) by 820 days.

(21) Appl. No.: 11/250,182

(22) Filed: Oct. 13, 2005

(65) Prior Publication Data

US 2006/0096225 A1 May 11, 2006

(30) Foreign Application Priority Data

Oct. 15, 2004 (DE) .......................... 10 2004 050 497

(51) Int. Cl.
A47B 5/00 (2006.01)
(52) U.S. Cl. ........................................................ 312/7.2
(58) Field of Classification Search ............. 248/346.01, 248/126, 231.81; 40/719, 725, 729, 730, 40/782, 784, 785; 312/7.2
See application file for complete search history.

(56) References Cited

U.S. PATENT DOCUMENTS

| | | | | | |
|---|---|---|---|---|---|
| 2,161,549 | A | * | 6/1939 | Most | 428/67 |
| 2,678,860 | A | * | 5/1954 | Peterson | 312/7.2 |
| 2,783,114 | A | * | 2/1957 | Raduns | 312/7.2 |
| 4,381,421 | A | * | 4/1983 | Coats et al. | 174/371 |
| 4,652,170 | A | * | 3/1987 | Lew | 403/381 |
| 5,119,271 | A | * | 6/1992 | Aoki et al. | 361/679.61 |
| 5,743,414 | A | * | 4/1998 | Baudino | 211/69.1 |
| 5,769,374 | A | * | 6/1998 | Martin et al. | 248/221.11 |
| 6,137,548 | A | * | 10/2000 | Uchida et al. | 348/818 |
| 6,177,165 | B1 | * | 1/2001 | Robbins et al. | 428/43 |
| 6,377,320 | B1 | * | 4/2002 | Ananian et al. | 348/836 |
| 6,480,243 | B2 | * | 11/2002 | Yamamoto | 348/836 |
| 2002/0194793 | A1 | * | 12/2002 | Bowron | 52/36.1 |
| 2003/0163969 | A1 | * | 9/2003 | Silverman | 52/655.1 |
| 2003/0184193 | A1 | * | 10/2003 | Lee et al. | 312/223.2 |
| 2003/0222541 | A1 | * | 12/2003 | Min | 312/7.2 |
| 2004/0129844 | A1 | * | 7/2004 | Doyle | 248/188.8 |
| 2004/0165118 | A1 | * | 8/2004 | Huber | 348/789 |
| 2005/0105178 | A1 | * | 5/2005 | Kim | 359/460 |

OTHER PUBLICATIONS

Root, Paul et al; "Housing with a front frame covering the housing opening"; Co-pending U.S. Appl. No. 11/250,175, filed Oct. 13, 2005; Published May 25, 2006 as Patent Application Publication 2006/0107577.*

* cited by examiner

*Primary Examiner* — Darnell M Jayne
*Assistant Examiner* — Matthew W Ing
(74) *Attorney, Agent, or Firm* — Pauley Petersen & Erickson

(57) ABSTRACT

A housing with a housing opening at a front, which is closed off by a frame put together from frame legs, wherein the frame opening is and/or can be closed off by a front and/or a cover plate. Accessories, such as handles, storage elements, support arms, pedestals, keyboards and the like are and/or can be connected with the frame legs of the frame. Continuous receiving grooves, open toward the outside, are formed on the outsides of the frame legs. Fastening opportunities are created at all frame locations by fastening devices which can be introduced into the receiving grooves, and thus it is possible to attach any desired accessories at any desired locations of the frame legs of the housing.

19 Claims, 3 Drawing Sheets

HOUSING HAVING A FRAME AROUND THE HOUSING OPENING AND ACCESSORIES WHICH CAN BE ATTACHED THERETO

BACKGROUND OF THE INVENTION

1. Field of the Invention

This invention relates to a housing with a housing opening at the front, which is closed off by a frame put together from frame legs, wherein the frame opening is and/or can be closed off by a front and/or a cover plate, and wherein accessories, such as handles, storage elements, support arms, pedestals, keyboards and the like are and/or can be connected with the frame legs of the frame.

2. Discussion of Related Art

Known housings are primarily constructed in a form of control devices and are used in a variety of designs. In this case the accessories are based on the employment of the housing, the installation location and the type of installation. Therefore various types of known housings of this kind exist, which are matched to their use. This increases the required stock of housings to be maintained for the various fields of use. A further disadvantage is that the installation of accessories often requires additional assembly work, which is not always easy to perform in connection with already installed and operating housings.

SUMMARY OF THE INVENTION

It is one object of this invention to provide a housing of the type mentioned above but which accessories of the most varied types can be installed in a simple manner, quickly and without large assembly operations, even on devices already in operation.

In accordance with this invention, this object can be achieved with continuous receiving grooves, open toward an outside, which are formed on exteriors of the frame legs. The receiving grooves form undercut receivers for the insertion of fastening blocks or for connecting blocks formed on the accessories. The fastening blocks and the connecting blocks are matched to the cross section of the receivers of the receiving grooves. An equally satisfactory result is obtained with continuous receiving grooves, open toward the outside, with longitudinally oriented threaded grooves that are formed in or on the exteriors of the frame legs. Fastening screws can be screwed into the receiving grooves designed as threaded grooves at any desired location. With the fastening screws the accessories or fastening elements for the attachment of accessories are and/or can be connected with the frame legs of the frame.

The receiving grooves formed on the exteriors of the frame legs do not interfere with the function of the housing, but instead offer fastening options for accessories at all circumferential locations. It is possible to close off the receiving grooves with simple cover elements in case they are not used.

The receiving grooves can receive fastening blocks or connecting blocks which are designed to match their cross section.

The fastening blocks can be introduced, such as pushed, into the receiving grooves of the frame legs and connected with the accessory. However, the fastening blocks can also be formed on the accessory, wherein individual elements or strip-shaped fastening blocks can be used.

If the receiving groove is designed as a threaded groove with longitudinal strips, then it is possible with fastening screws to fixedly connect accessories directly with the frame legs at any location in the receiving groove.

Advantageously, the structure of the frame for the housing can be such that the frame legs are connected with each other via corner elements which are open toward the outside of the frame. The corner elements can be connected with the adjacent frame legs by fastening flanges, in which the receivers of the receiving grooves are continued. The corner elements are and/or can be closed on the outside by a cover element. In this way the corner elements permit the simple introduction of the fastening blocks or of the connecting blocks into the receiving grooves of the frame legs. The cover elements close the corner elements in a visually pleasing manner.

In one embodiment, the esthetics of the housing, which is distinguished because spaces in the receiving grooves of the frame legs, which are not occupied by a fastening block or connecting block, are covered flush with the frame legs by introduced cover elements, such as weatherstripping or the like.

This also equally applies if the spaces in the receiving grooves of the frame legs which are not covered by an accessory are covered flush with the frame legs by introduced cover elements, such as weatherstripping or the like.

In one embodiment, the accessory is designed as a storage tray, which is connected with the lower horizontal frame leg of the frame, wherein a fastening block embodied as a strip is formed on the exterior of the rear wall of the storage tray, and the storage tray is optimally matched to the lower frame leg of the frame of the housing. In this case, the connection of the parts can take place differently in such a way that the storage tray and the fastening block designed as a fastening elbow are connected with each other by screw connections.

In many cases, an accessory designed as a keyboard is to be connected with the housing embodied as a control device. In one embodiment, the accessory has a frame comprising frame legs with identical receiving grooves and receives a keyboard. The housing and the frame are connected with the keyboard via a joint, and the joint is connected by two fastening blocks designed as strips with the facing frame legs of the housing and the accessory. In this case, the fastening blocks designed as strips can be formed on the two joint elements of the joint. In this way the keyboard can be placed into an advantageous working position.

If the housing is to be easily portable, in a further embodiment, the fastening blocks are designed as strips to be formed on the two lateral legs of a U-shaped handle element. In this case two fastening blocks are required per handle element, which are fixed in place with an appropriate spacing in the receiving groove of a frame leg.

If the housing is incorporated in a work station, it is possible to create an additional working surface, for example for a mouse, because the accessory is designed as a horizontally oriented storage board, which is connected by a fastening elbow having a fastening block with a receiving groove of a vertical frame leg of the frame.

BRIEF DESCRIPTION OF THE DRAWINGS

This invention is explained in greater detail in view of exemplary embodiments represented in the drawings, wherein.

DETAILED DESCRIPTION OF PREFERRED EMBODIMENTS

Figure 1:
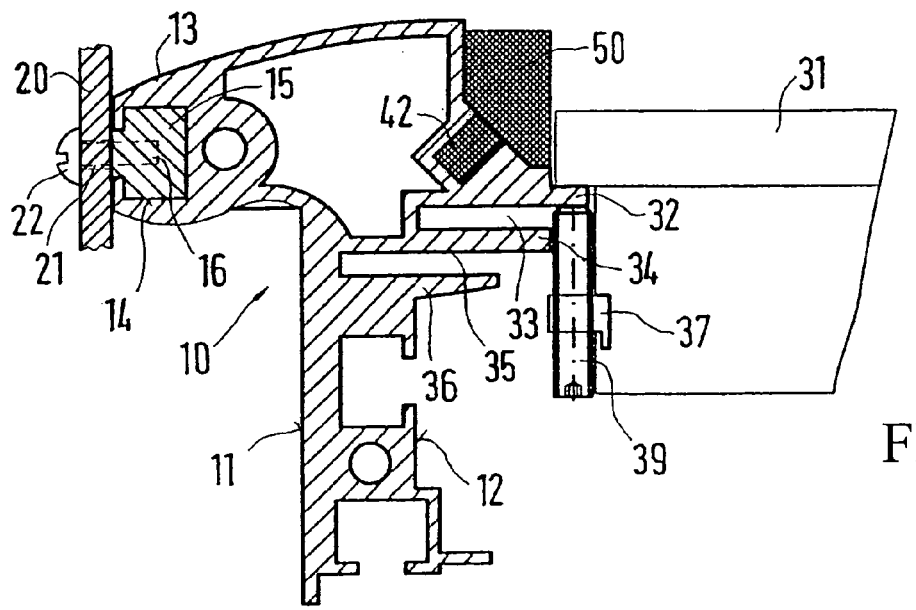
FIG. 1 shows a cross section of a frame leg with a receiving groove formed on an exterior, into which a fastening block connected with the accessory inserted.
Figure 2:
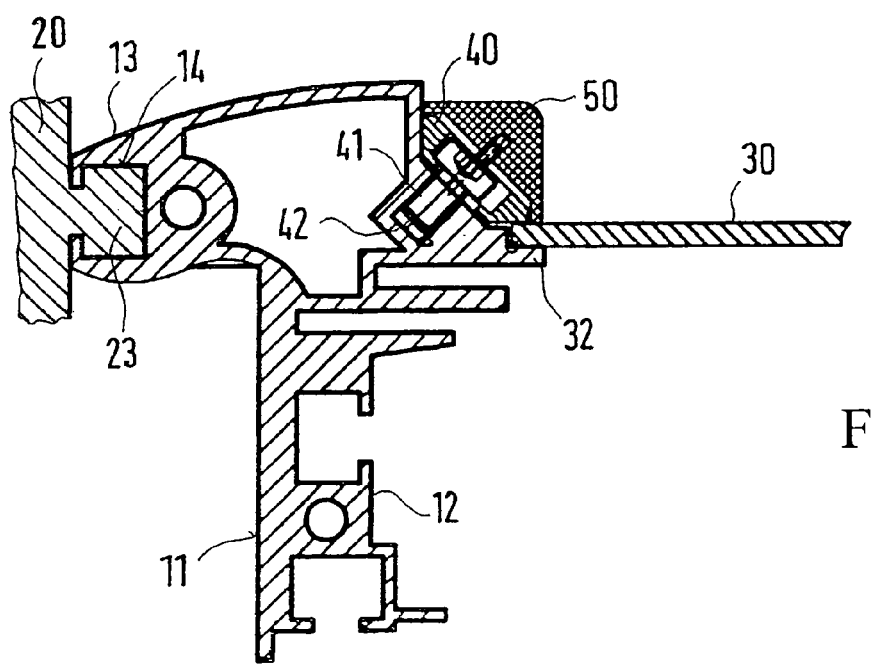
FIG. 2 shows a cross section taken through the frame leg, corresponding to FIG. 1, into which the receiving groove a connecting block formed on the accessory is inserted.

Two different fastening types of an accessory on the frame closing off the housing opening are shown in the cross sectional views in FIGS. 1 and 2. As shown in FIG. 1, the frame made of the frame legs 10 can receive a front element of a built-in housing 31, which rests on an inwardly oriented strip 32 and is maintained thereon by a screw 39. The screw 39 can be adjusted in a holder 37 fastened on the built-in housing 31. The inwardly oriented strips 34 and 36 form grooves 33 and 35 on the inside 12 of the frame leg 10 and can also receive, for example, a transparent cover panel and a front plate with display and operating elements. The frame leg 10 forms a receiver 42 for a sealing element 50, which seals the junction between the built-in housing 31 and the frame leg 10.

A receiving groove 13 is formed on the exterior 11 of the frame leg 10, whose undercut receiver 14 is open toward the outside. Fastening blocks 15 of matching diameter can be pushed into this receiving groove 13. One fastening block 15 per fastening space can be used. An appropriate strip can also be used for several fastening spaces.

Here a threaded receiver 16, which ends flush with the receiver 14, is cut into the fastening block 15, so that an accessory 30 can be attached to the frame leg 10 by a fastening screw 22. The fastening screw 22 is passed through a fastening bore 21 of the accessory 20.

In the embodiment in accordance with FIG. 2, a front plate 30 is maintained, resting on the strip 32, by a holding element 40, which overlaps the edge of the front plate 30 and is pulled tight in the corner element by a screw 41 in the screw receiver 42. The holding element 40, including the edge of the front plate 30, is sealed by a sealing element 50. The accessory 20 connected with the frame leg 10 has a connecting block 23 formed on it, which is also embodied as a strip and is pushed into the receiver 14 of the receiving groove 13. The frame is assembled from four frame legs 10, which are cut off a profiled strand.

Corner connectors provide the connection of the frame legs 10, which meet at an angle of 90° in the corner areas of the frame. The corner connectors are open toward the outside and are connected by flanges with the front faces of the frame legs 10. These flanges also cover the receiving grooves 13 and extend the receiver 14, so that the introduction of the fastening blocks 15 and the connecting blocks 23 is not being hampered.

Figure 3:
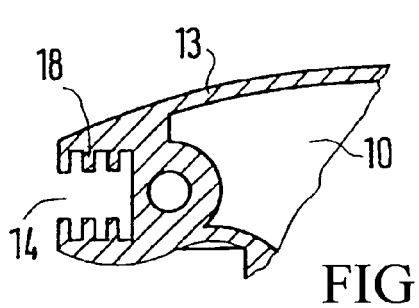
FIG. 3 is a partial sectional view taken through a receiving groove, designed as a threaded groove, of a frame leg.

As shown in the partial sectional view of FIG. 3, additional longitudinal strips 18 can be oriented so they face each other and form the receiving groove 13 for the threaded groove. Threaded screws can be screwed into the groove at any desired location if the strips 18 are matched to the pitch of the threaded screws. In this case the accessory rests flush against the open side of the receiver 14.

Figure 4:
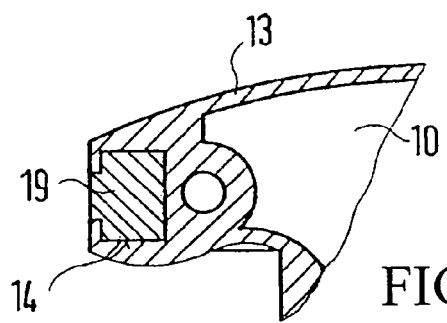
FIG. 4 shows a partial sectional view of a receiving groove closed off by a cover element at a space of the frame leg not occupied by an accessory.

As shown in FIG. 4, the places in the receiver 14 of the receiving groove 13 which are not occupied or covered by fastening blocks 15, connecting blocks 13 or accessories 20, can be closed flush with the frame leg 10 by a weatherstrip-like cover element 19.

Figure 5:
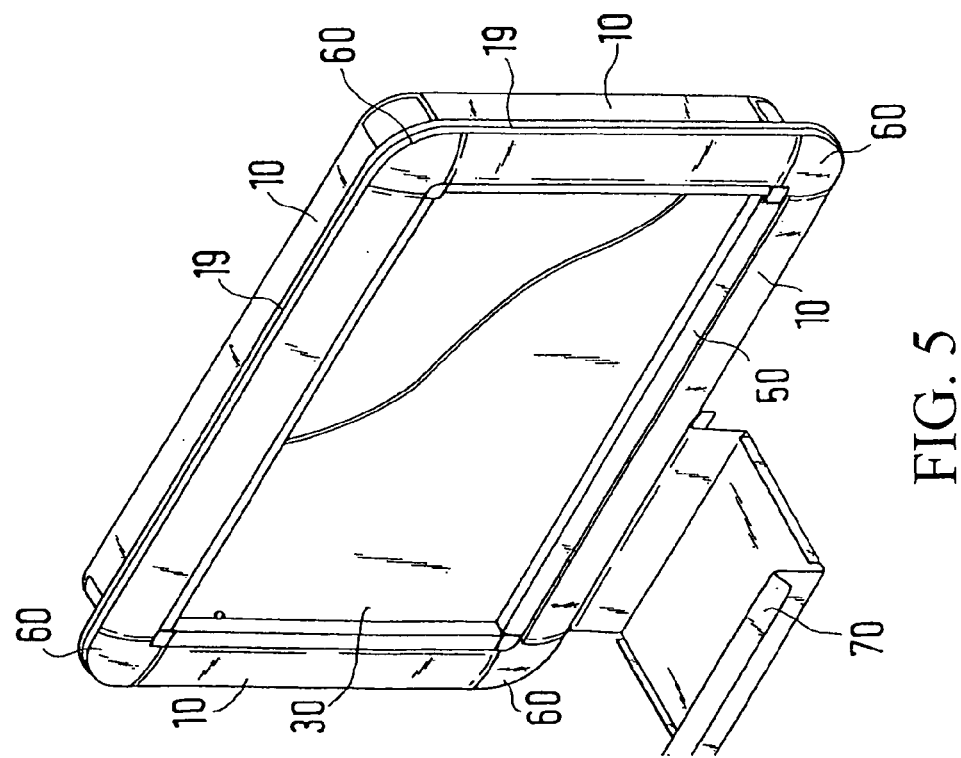
FIG. 5 is a perspective plan view of an operating housing with a horizontal storage tray attached to the lower frame leg.

The perspective plan view in FIG. 5 shows a flat housing, whose front is closed off by a frame comprising frame legs 10 and corner elements 60 and receives a front plate 30, which can support display and/or operating elements. The plate can also be a transparent cover panel behind which the actual front plate is arranged. A horizontal cover tray 70 is attached to the lower horizontal frame leg 10 as the accessory 20, wherein a strip-like fastening block 15 is formed on the outside of the rear wall. This fastening block 15 is upwardly oriented and is introduced into the receiving groove 13, which is open at the underside, of the lower frame leg 10. In this case the storage tray 70 can also be screwed to a fastening elbow, which supports the upwardly oriented strip-like fastening block 15.

Figure 6:
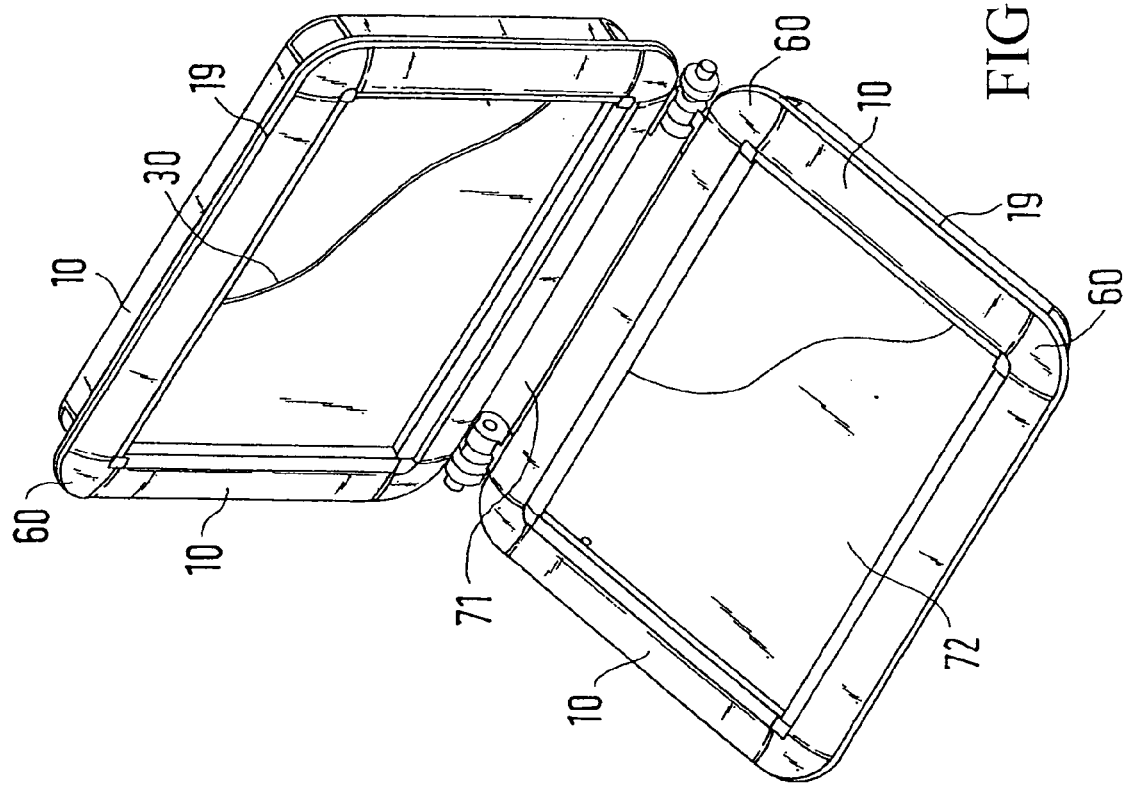
FIG. 6 is a perspective plan view of an operating housing with a keyboard housing attached to the lower frame leg.

As FIG. 6 shows, two frame-like housings, for example a control device in the form of a flat housing and a receiver housing with a keyboard 72, can be connected with each other by a joint 71. Both joint elements of the joint 71 terminate in strip-like formed-on elements. The connecting strips are introduced into the receiving grooves 13 of the frame legs 10 which are to be connected with each other via the joint 71. It is possible to change and adjust the position of the two housings in relation to each other. In place of the joint 71, it is also possible to employ a connecting element designed to have a defined angle of inclination, which terminates at the predetermined angle in two connecting strips. The cross sections of these connecting strips are matched to the receivers 14 of the frame legs 10 to be connected. Thus, the connecting and/or joint function can be realized in various structural ways.

Figure 7:
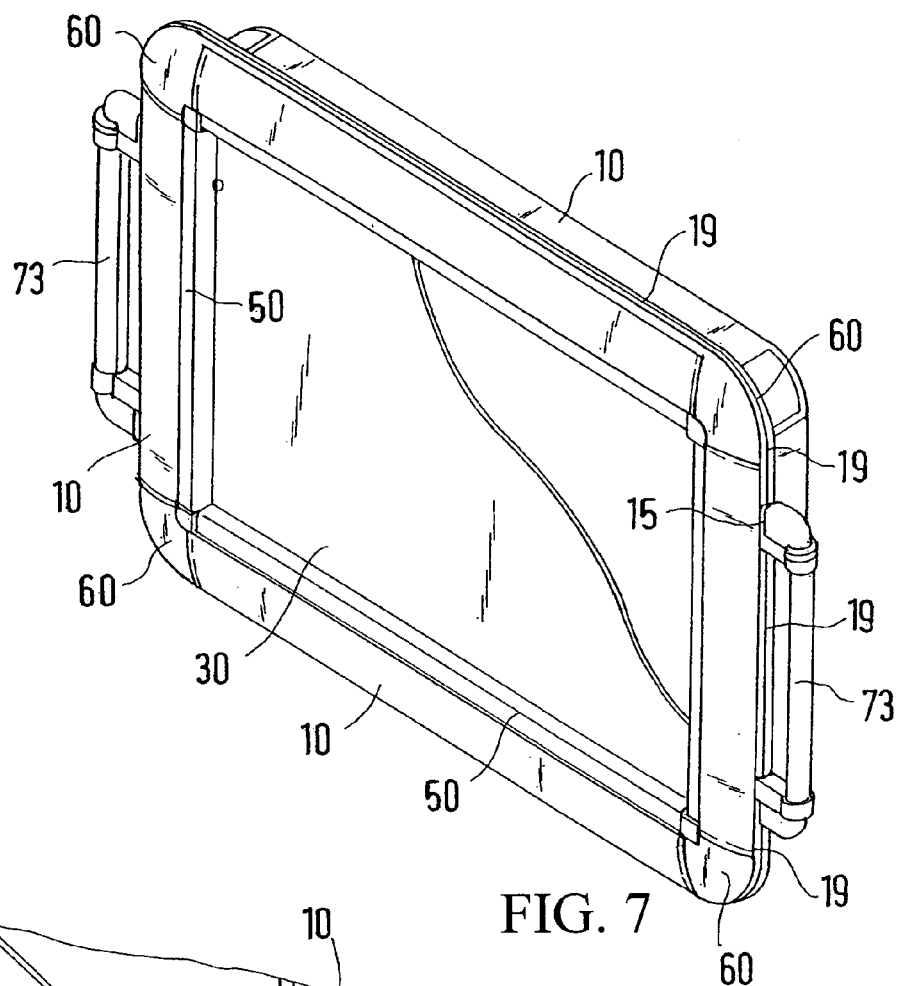
FIG. 7 is a perspective plan view of a flat housing with handle elements attached to both vertical frame legs.

The flat housing in accordance with FIG. 7 can be designed as a portable housing, for example, if U-shaped handle elements 73 are attached as accessories to the frame legs 10 constituting the narrow sides. In this case the free ends of the lateral legs of the handle elements 73 can terminate in fastening blocks 15, which are matched to the cross section of the undercut receivers 14 of the receiving grooves 13 of these frame legs 10, and can be pushed in through the open corner connectors 60. Following the application of the handle elements 73, the corner connectors 60 are closed off by cover elements. The places of the receiving grooves 13 not occupied by accessories are closed by pushed-in, weatherstrip-shaped cover elements 19, such as shown in FIG. 4. In the embodiment in accordance with FIG. 7, this applies to all four frame legs 10.

Figure 8:
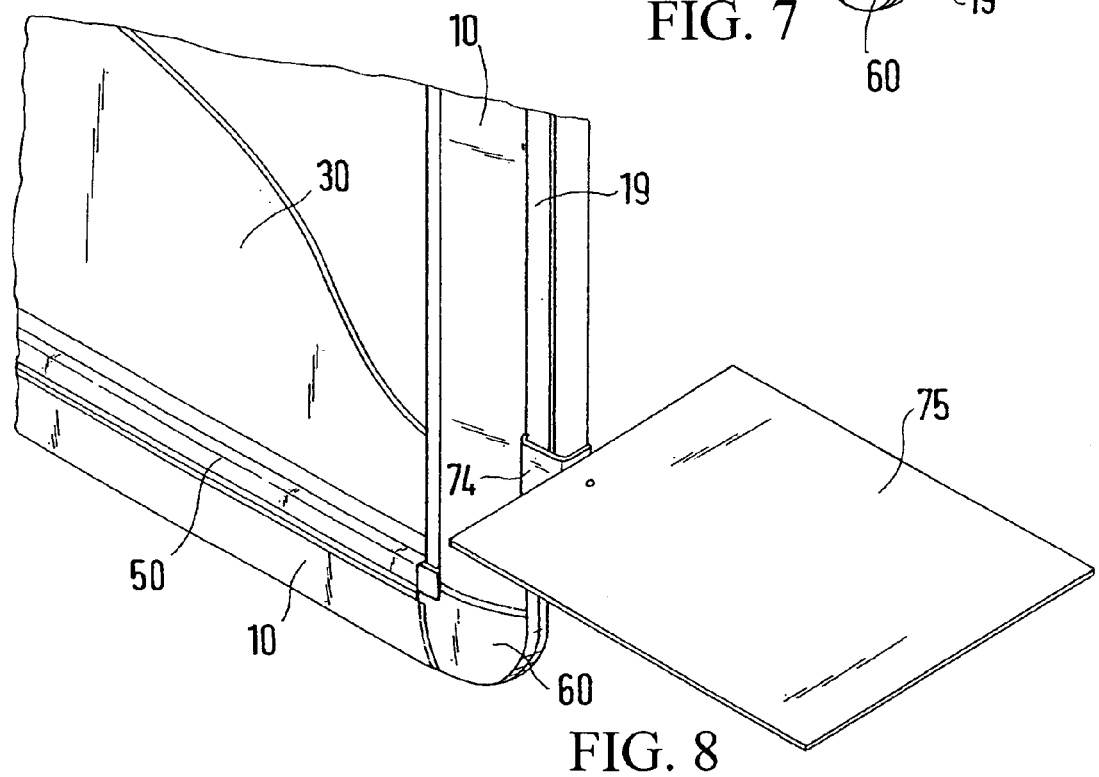
FIG. 8 is a partial perspective view of the lower lateral portion of the housing, to which a horizontally oriented storage board is attached.

FIG. 8 shows a lower corner area of a housing, wherein the vertical frame leg 10 is connected with a horizontal storage board 75 forming the accessory. The storage board 75 is screwed together with a leg of a fastening elbow 74, wherein a fastening block 15 of its other leg is introduced into the receiving groove 13 of this frame leg 10. This is possible at any time, because the covering in the corner areas 60 can be removed and access to the ends of the receiving grooves 13 can be provided. Following the attachment of the fastening elbow 74 to the frame leg 10, the unoccupied sections of the receiving groove 13 can be closed off by cover elements 19.

German Patent Reference 10 2004 050497.0-26, the priority document corresponding to this invention, and its teachings are incorporated, by reference, into this specification.

What is claimed is:

1. A housing, comprising:
a housing opening for a control device, display, or operating elements and at a housing front;

a frame enclosing the housing opening, the frame including frame legs and corner elements, each of the corner elements connecting one of the frame legs to another of the frame legs;

each of the frame legs and the corner elements including a receiving groove extending in an outside surface from a first end to an opposing second end;

the corner elements connectable with adjacent frame legs by fastening flanges, and the receiving groove of each of the corner elements aligned with the receiving groove of each of the adjacent frame legs;

a plurality of substitutable accessories each comprising a fastening block or connecting block for connecting to the receiving groove;

the receiving groove of each of the frame legs and the corner elements forming a receiver for receiving the fastening block or connecting block of at least one of the accessories, wherein the receiver has a first receiver portion having a first receiver width corresponding to a first block width of the fastening block or connecting block, on a side of the receiver that is open at the outside surface the receiver has a second receiver portion having a second receiver width that is less than the first receiver width and connecting the first receiver portion to the outside surface, and the fastening block or the connecting block of each of the accessories includes a portion having a second block width that is less than the first block width and that is matched to the second receiver width of the receiver of each of the receiving grooves; and each of the frame legs including a plurality of strips extending from an inside surface into the housing opening, the strips disposed parallel and spaced apart from the front side of the housing opening toward a back side of the housing opening, a first of the strips positioned toward the front side of the housing opening and including a surface facing the front side of the housing for receiving thereon a cover panel or a front element of the control device, display, or operating elements installed in the housing opening, a second of said strips having a portion overlapping said first strip; and a groove between said first strip and said overlapping portion of said second strip.

2. The housing in accordance with claim 1, wherein spaces in the receiving grooves (13) of the frame legs (10) which are not occupied by one of the accessories or one of the fastening block (15) or the connecting block (23) are covered flush with the frame legs (10) by introduced cover elements (19).

3. The housing in accordance with claim 1, wherein the accessories (20) comprise a storage tray (70) connected with the lower horizontal frame leg (10) of the frame, and a fastening block (15) or a connecting block (23) is formed as a strip on an exterior of a rear wall of the storage tray (70).

4. The housing in accordance with claim 3, wherein the fastening block (15) comprises a fastening elbow, and wherein the storage tray and fastening elbow are connected with each other by screw connections.

5. The housing in accordance with claim 1, wherein the accessories (20) comprise a frame including additional frame legs (10) with identical receiving grooves (13), said frame receiving a keyboard (72), wherein the housing is connected with the frame via a joint (71), and the joint (71) comprises two fastening blocks (15) or two connecting blocks (23) connected with adjacent frame legs (10) of the housing and the accessory.

6. The housing in accordance with claim 5, wherein the fastening blocks (15) or connecting blocks (23) comprise strips formed on the two joint elements of the joint (71).

7. The housing in accordance with claim 1, wherein the accessories (20) comprise a U-shaped handle element (73) with lateral legs that terminate in the fastening blocks (15) or connecting blocks (23).

8. The housing in accordance with claim 1, wherein the accessories (20) comprise a horizontally oriented storage board (75); and a fastening elbow (74) having a fastening block (15) or a connecting block (23); wherein said fastening block or connecting block, is connected with a receiving groove (13) of the vertical frame leg (10) of the frame.

9. The housing in accordance with claim 1, wherein the front element rests on a first side of the strip and is maintained thereon by a screw fastened against a second side of the strip that is opposite the first side.

10. The housing in accordance with claim 9, wherein the frame legs comprise a sealing element receiver for a sealing element which seals a junction between the housing and the control device, display, or operating elements installed in the housing opening.

11. The housing in accordance with claim 10, wherein the front element rests on the strip and is maintained thereon by the sealing element installed in the receiver, wherein the front element is disposed between the strip and the sealing element.

12. The housing in accordance with claim 1, wherein a portion of the fastening block or connecting block extends under the portion of the outside surface of one of the frame legs to secure the fastening block or connecting block to the one of the frame legs to attach the accessory to the housing with a portion of the accessory being outside the receiver.

13. The housing in accordance with claim 1, further comprising a sealing element attachable to a sealing element receiver adjacent the first side of the front strip and in each of the frame legs, wherein the sealing element seals a junction between the housing and the cover panel or the front element received on the first surface of the front strip.

14. A housing, comprising:

a housing opening for a control device, display, or operating elements and at a housing front;

a frame including frame legs and corner elements enclosing the housing opening;

a front strip extending from the frame into the housing opening, the front strip positioned at a front side of the housing opening, the front strip including a first surface facing the front side of the housing and a second surface opposite the first surface, wherein each of the frame legs includes a portion of the front strip and the first surface receives thereon a cover panel or a front element of the control device, display, or operating elements installed in the housing opening;

a second strip extending from the frame into the housing opening at an offset position from the front strip, the second strip disposed adjacent to and including a portion overlapping and parallel to the second surface of the front strip and separated from the second surface of the first strip by a groove that is between the front strip and the overlapping portion of the second strip, wherein each of the frame legs includes a section of the second strip;

a sealing element attachable to a receiver adjacent the first side of the front strip in each of the frame legs, and which seals a junction between the housing and the cover panel or the front element that is received on the first surface of the front strip;

each of the frame legs and the corner elements including a receiving groove forming a further receiver that is open toward an outside of the housing and extending in an outside surface from a first frame leg end to an opposing second frame leg end; and an accessory including a fastening block or connecting block matched to cross sections of the further receivers of the receiving grooves, wherein the fastening block or connecting block fits within the further receiver of one of the frame legs to attach the accessory to the housing with a portion of the accessory external of the receiver, the accessory comprising a handle, a storage element, a support arm, a pedestal, or a keyboard.

15. The housing in accordance with claim 14, wherein the accessories (20) comprises a U-shaped handle element (73) with lateral legs.

16. The housing in accordance with claim 14, wherein spaces in the receiving grooves (13) of the frame legs (10) not covered by the accessory (20) or one of the fastening block (15) or the connecting block are covered flush with the frame legs (10) by introduced cover elements (19).

17. The housing in accordance with claim 14, wherein the accessory (20) comprises a storage tray (70).

18. The housing in accordance with claim 14, wherein the accessory (20) comprises a frame including additional frame legs (10) with identical receiving grooves (13), said frame receiving a keyboard (72), wherein the housing and the frame are connected via a joint (71).

19. The housing in accordance with claim 14, wherein a portion of the fastening block or connecting block extends within the receiver beneath a portion of the outside surface of one of the frame legs to secure the fastening block or connecting block to the one of the frame legs to attach the accessory to the housing with a portion of the accessory being outside the receiver.

* * * * *